(12) United States Patent
Ohashi et al.

(10) Patent No.: US 11,596,090 B2
(45) Date of Patent: Feb. 28, 2023

(54) TAPE FEEDER AND CARRIER TAPE LOADING METHOD

(71) Applicant: FUJI CORPORATION, Chiryu (JP)

(72) Inventors: Hiroyasu Ohashi, Toyota (JP); Hiroki Murase, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 528 days.

(21) Appl. No.: 16/620,557

(22) PCT Filed: Jun. 16, 2017

(86) PCT No.: PCT/JP2017/022397
§ 371 (c)(1),
(2) Date: Dec. 9, 2019

(87) PCT Pub. No.: WO2018/229989
PCT Pub. Date: Dec. 20, 2018

(65) Prior Publication Data
US 2021/0153397 A1    May 20, 2021

(51) Int. Cl.
*H05K 13/02* (2006.01)
*H05K 13/04* (2006.01)
(Continued)

(52) U.S. Cl.
CPC ........... *H05K 13/021* (2013.01); *B65H 23/18* (2013.01); *H05K 13/02* (2013.01);
(Continued)

(58) Field of Classification Search
CPC .. H05K 13/02; H05K 13/021; H05K 13/0417; H05K 13/0419; H05K 13/086;
(Continued)

(56) References Cited

U.S. PATENT DOCUMENTS

| 4,610,083 A * | 9/1986 | Campisi ............. H05K 13/0452 227/1 |
| 2014/0367049 A1* | 12/2014 | Higuchi ............... B65H 37/002 156/719 |

(Continued)

FOREIGN PATENT DOCUMENTS

| EP | 2938177 A1 * | 10/2015 | ........... H05K 13/021 |
| JP | 2015-103663 A | 6/2015 | |

(Continued)

OTHER PUBLICATIONS

International Search Report dated Aug. 15, 2017 in PCT/JP2017/022397 filed on Jun. 16,2017, 2 pages.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

The control device of a tape feeder, during the loading processing, in a case in which carrier tape that is preadjusted such that a length from a first cavity, which houses the electronic component and which is first from the leading end of the carrier tape among the multiple cavities, to the leading end of the carrier tape is a regulated length is inserted into the insertion section, starts conveyance of the carrier tape and makes a position of the first cavity a specified position in the feeder main body in accordance with a detection result of the detection sensor.

10 Claims, 5 Drawing Sheets

(51) Int. Cl.
 *H05K 13/08* (2006.01)
 *B65H 23/18* (2006.01)

(52) U.S. Cl.
 CPC ....... *H05K 13/0419* (2018.08); *H05K 13/086* (2018.08); *H05K 13/0882* (2018.08); *Y10T 29/53174* (2015.01)

(58) Field of Classification Search
 CPC ............ H05K 13/0882; Y10T 29/4913; Y10T 29/53174; Y10T 29/53178; B65H 23/18
 See application file for complete search history.

(56) References Cited

U.S. PATENT DOCUMENTS

| | | |
|---|---|---|
| 2017/0196132 A1 | 7/2017 | Ohashi et al. |
| 2018/0007820 A1 | 1/2018 | Murase et al. |
| 2018/0376630 A1 | 12/2018 | Otsuki et al. |

FOREIGN PATENT DOCUMENTS

| | | |
|---|---|---|
| WO | WO 2015/181958 A1 | 12/2015 |
| WO | WO 2016/117091 A1 | 7/2016 |
| WO | WO 2016/203628 A1 | 12/2016 |

\* cited by examiner

TAPE FEEDER AND CARRIER TAPE LOADING METHOD

TECHNICAL FIELD

The present disclosure relates to a tape feeder and a carrier tape loading method.

BACKGROUND ART

Tape feeders are used in electronic component mounting machines that mount components on a circuit board. Among tape feeders, there are autoloading types that can automatically load a carrier tape inserted via an insertion section provided at a rear portion of the tape feeder, as disclosed in, for example, patent literature 1. The autoloading tape feeder positions a cavity of the carrier tape at a supply section that supplies an electronic component to the electronic component mounting machine, for example, when a new or refill carrier tape is loaded.

CITATION LIST

Patent Literature

Patent literature 1: International publication WO2015/181958

BRIEF SUMMARY

Technical Problem

In order to stabilize the feeding of the electronic components immediately after the carrier tape is loaded, the conveyance may be continued to some extent even after the leading end of the carrier tape has passed through the supply section. In such cases, if an electronic component is stored in a cavity that has passed through the supply section, the electronic component is wasted without being supplied to the electronic component mounting machine. Also, if empty cavities are provided near the leading end of the carrier tape, an empty cavity may be positioned at the supply section, resulting in a supply error.

It is an object of the present disclosure to provide a tape feeder and a carrier tape loading method capable of stabilizing electronic component supply immediately after carrier tape loading and preventing electronic components from being wasted.

Solution to Problem

Disclosed herein is a tape feeder including: a feeder main body including an insertion section into which a leading end of a carrier tape housing electronic components is inserted, and a supply section configured to supply the electronic components to an electronic component mounting machine; a driving device provided on the feeder main body and configured to convey the carrier tape; a detection sensor configured to detect a leading end of the carrier tape at a conveyance path provided between the insertion section and the supply section; and a control device configured to control the driving device such that the carrier tape inserted into the insertion section is conveyed to the supply section, and perform loading processing of loading the carrier tape, wherein multiple cavities each housing one of the electronic components are formed in the carrier tape at a specified internal in a conveyance direction of the carrier tape, and the control device is configured to, during the loading processing, in a case in which the carrier tape that is preadjusted such that a length from a first cavity, which houses the electronic component and which is first from the leading end of the carrier tape among the multiple cavities, to the leading end of the carrier tape is a regulated length, is inserted into the insertion section, start conveyance of the carrier tape and make a position of the first cavity a specified position in the feeder main body in accordance with a detection result of the detection sensor.

Also disclosed herein is a carrier tape loading method for loading a carrier tape housing electronic components to a tape feeder, the tape feeder being provided with a feeder main body including an insertion section into which a leading end of a carrier tape is inserted, and a supply section configured to supply the electronic components to an electronic component mounting machine, a driving device provided on the feeder main body and configured to convey the carrier tape, a detection sensor configured to detect a leading end of the carrier tape at a conveyance path provided between the insertion section and the supply section, and a control device configured to control the driving device such that the carrier tape inserted into the insertion section is conveyed to the supply section, and perform loading processing of loading the carrier tape, wherein multiple cavities each housing one of the electronic components are formed in the carrier tape at a specified internal in a conveyance direction of the carrier tape, the loading method including: during the loading processing, performing an adjusting process of preadjusting the carrier tape such that a length from a first cavity, which houses the electronic component and which is first from the leading end of the carrier tape among the multiple cavities, to the leading end of the carrier tape is a regulated length, and, when the preadjusted carrier tape is inserted into the insertion section, performing a positioning process of starting conveyance of the carrier tape and making a position of the first cavity a specified position in the feeder main body in accordance with a detection result of the detection sensor.

Advantageous Effects

According to such a tape feeder and carrier tape loading method, a carrier tape for which the length from the first cavity to the leading end is adjusted to a regulated length can be loaded so as to position the first cavity at a specified position in the feeder main body. As a result, when the first cavity is positioned at the supply section, the width direction position of the carrier tape is stabilized because the leading end of a regulated length is maintained, thus electronic components can be supplied stably. Further, since no electronic components are housed further towards the leading end than the first cavity, it is possible to prevent electronic components from being wasted.

DESCRIPTION OF EMBODIMENTS

1. Embodiments 1-1. Overview of Tape Feeder 1

Figure 1:
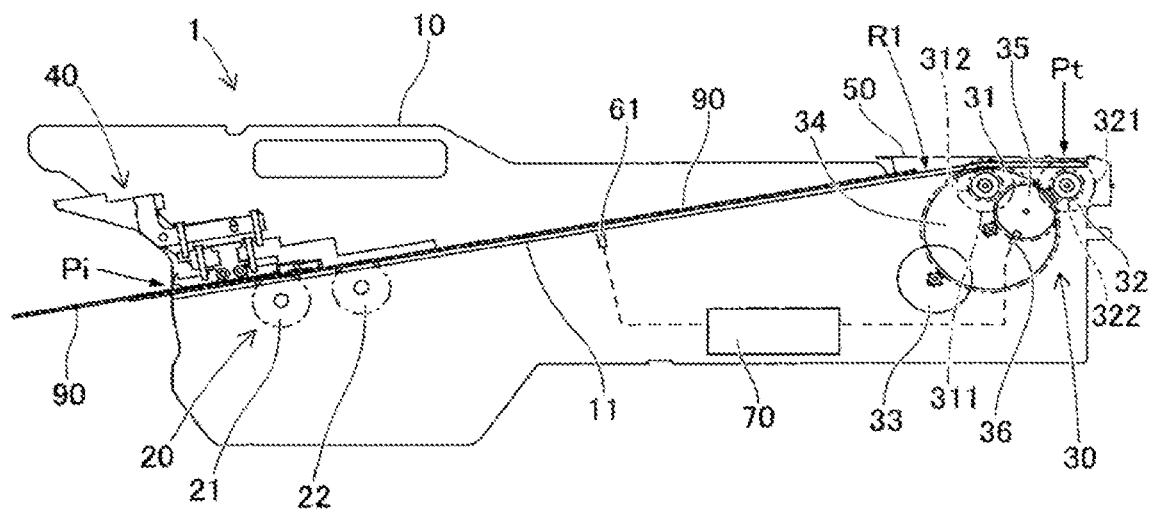
FIG. 1 is a side view showing the entire tape feeder of an embodiment.

Tape feeder 1 is an autoloading tape feeder used in an electronic component mounting machine that mounts components on a circuit board to produce board products. Hereinafter, the electronic component mounting machine is referred to as "component mounter", the tape feeder is referred to as "feeder", the circuit board is referred to as "board", and the electronic component is referred to as "component". As shown in FIG. 1, feeder 1 performs loading processing of conveying carrier tape 90 along rail 11 from insertion section Pi at which carrier tape 90 is inserted. Feeder 1 conveys the loaded carrier tape 90 to supply section Pt at which components are supplied to the component mounter, so that the components can be supplied at supply section Pt.

Feeder 1, in a state set in the component mounter, conveys carrier tape 90 by feeding the carrier tape 90 at predetermined pitches. For example, during usage, when the remaining amount of the current carrier tape 90 is less than a predetermined amount, feeder 1 conveys replenishment carrier tape 90. This allows feeder 1 to continuously feed components without splicing the replenishment carrier tape 90 to the current carrier tape 90. Further, when the loaded carrier tape 90 is to be removed, feeder 1 performs unloading processing of conveying the carrier tape 90 to insertion section Pi.

1-2. Configuration of Carrier Tape 90

Figure 2:
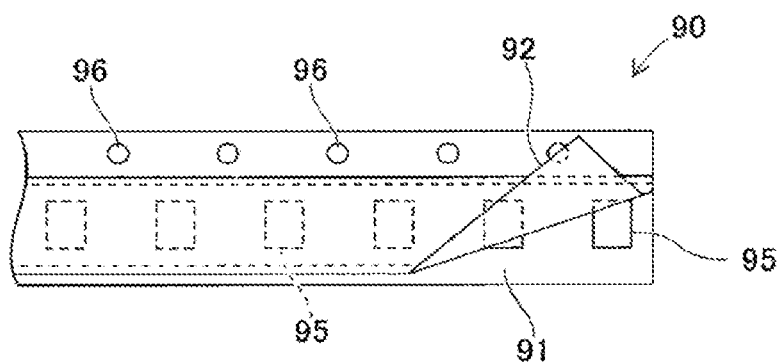
FIG. 2 is a plan view showing a portion of a carrier tape.

Carrier tape 90 houses many components in a line, as shown in FIG. 2. Carrier tape 90 has base tape 91 and cover tape 92. Base tape 91 is formed of a flexible material such as paper or resin. Cavities 95 are formed in base tape 91 near the center in the widthwise direction (vertical direction in FIG. 2). Cavities 95 are a recess with a bottom. Cavities 95 are formed at predetermined intervals in the conveyance direction of base tape 91 (the longitudinal direction of carrier tape 90, which is the left-right direction in FIG. 2). Each cavity 95 houses a component.

Further, engagement holes 96 are formed in base tape 91 at an edge section in a width direction of base tape 91. Engagement holes 96 are formed at predetermined intervals in the longitudinal direction of base tape 91. Engagement holes 96 penetrate carrier tape 90 in the thickness direction of carrier tape 90 (direction perpendicular to the page in FIG. 2). Here, multiple cavities 95 are formed at predetermined intervals in the conveyance direction, similar to the multiple engagement holes 96. Interval T1 of cavities 95 is set appropriately according to the dimensions of the components being housed.

Figure 4:
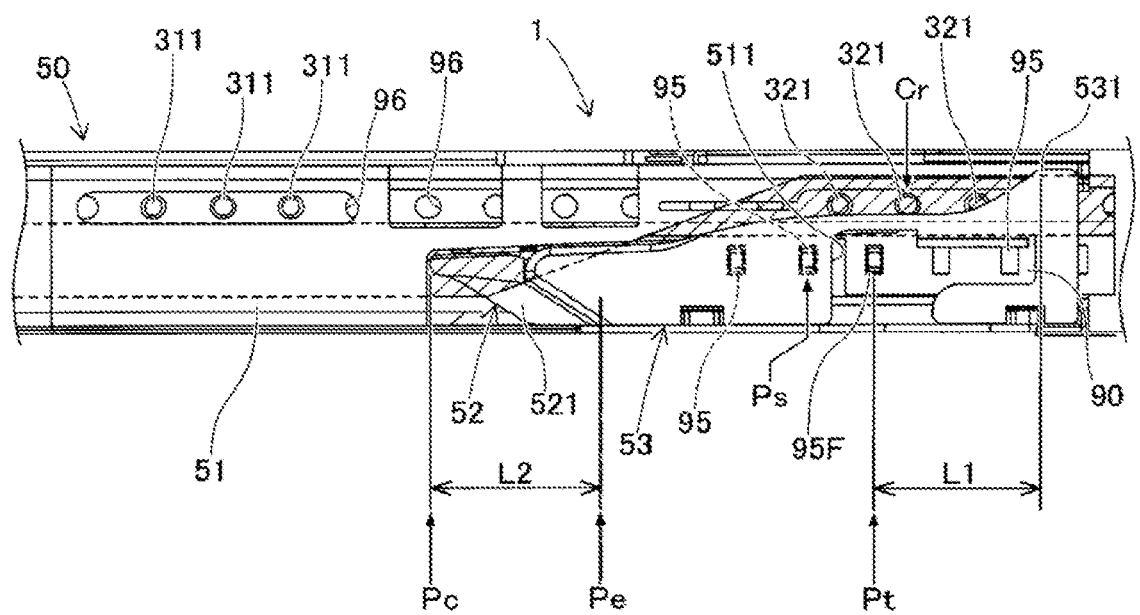
FIG. 4 is an enlarged plan view of the leading end section in FIG. 1.
Figure 6:
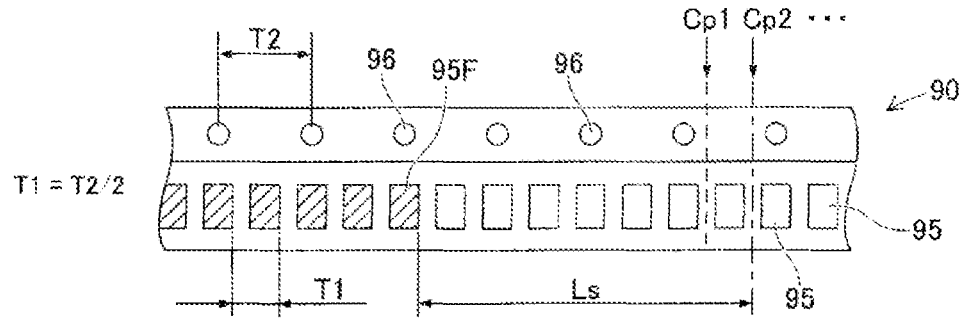
FIG. 6 illustrates regulated lengths for multiple types of carrier tapes.
Figure 6:
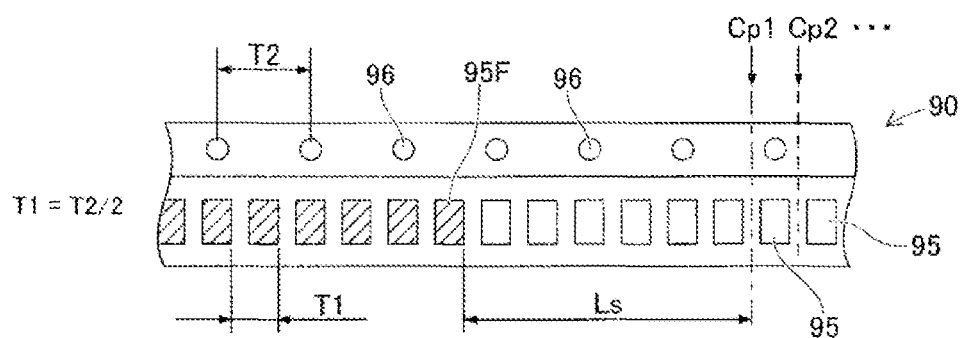
Figure 6:
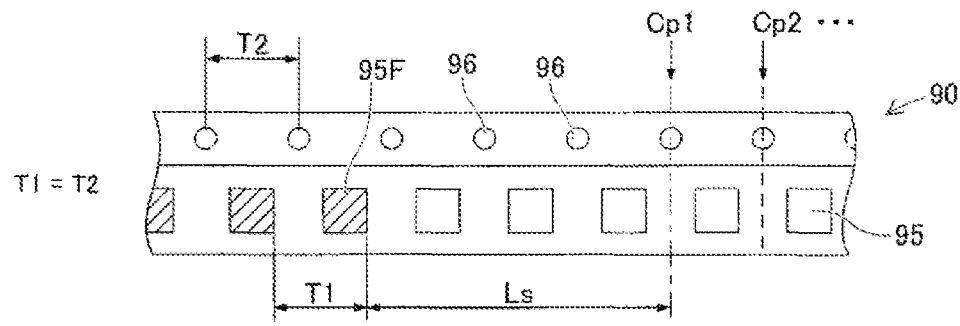

For example, as shown in FIG. 6, interval T1 of cavities 95 is set to be half of interval T2 of engagement holes 96 (that is, T1=T2/2), is set to be equal to interval T2 of engagement holes 96 (that is, T1=T2), or the like. Similar to the carrier tape 90 third from the top in FIG. 6, FIG. 4 shows carrier tape 90 set such that interval T1 of cavities 95 is equal to interval T2 of engagement holes 96. Note that, FIG. 6 does not show cover tape 92, and shows cavities housing components with shading, and empty cavities 95 without shading.

Cover tape 92 is formed from a thin polymer film. Both edges of cover tape 92 in the width direction are attached to the upper surface of base tape 91. Thus, cover tape 92 covers the opening sections of cavities 95. As a result, the components housed in cavities 95 of base tape 91 are prevented from falling out. Cover tape 92 is peeled off by tape guide 50 of feeder 1 immediately before supply section Pt of feeder 1. Hereinafter, carrier tape is referred to as "tape".

1-3. Detailed Configuration of Feeder 1

As shown in FIG. 1, feeder 1 includes feeder main body 10, first driving device 20, second driving device 30, tape support unit 40, tape guide 50, biasing device 55, detection sensor 61, and control device 70. In descriptions below, the downstream side (right side in FIG. 1) in the conveying direction in which the tape 90 is conveyed during loading processing is taken as the front, and the upstream side (left side in FIG. 1) in the conveying direction is taken as the rear. Feeder main body 10 is formed in the form of a flat box and is set in a slot of the component supply device provided on the component mounter. Feeder main body 10 includes rail 11 that constitutes conveyance path R1 between insertion section Pi and supply section Pt.

First driving device 20 includes first sprocket 21 and second sprocket 22 rotatably supported on feeder main body 10. First sprocket 21 and second sprocket 22 are provided at insertion section Pi. Second driving device 30 includes third sprocket 31 and fourth sprocket 32 provided below the rail in supply section Pt. Third sprocket 31 and fourth sprocket 32 have engagement projections 311 and 321 (see FIG. 4) arranged circumferentially at equal intervals over the entire circumference of the sprocket.

Since the configuration for rotating first sprocket 21 and second sprocket 22 of first driving device 20 and the configuration for rotating third sprocket 31 and fourth sprocket 32 of second driving device 30 are substantially the same, second driving device 30 will be described below. As shown in FIG. 1, second driving device 30 includes stepping motor 33 as a drive source for rotating third sprocket 31 and fourth sprocket 32.

Stepping motor 33 rotates the rotation shaft in accordance with the inputted pulse power. When the rotation shaft of stepping motor 33 rotates, deceleration gear 34 engaged with the drive gear provided on the above-mentioned rotation shaft rotates. The driving force outputted by stepping motor 33 is transmitted to third sprocket 31 and fourth sprocket 32 via intermediate gear 35 that engages with deceleration gear 34. Intermediate gear 35 constantly engages with sprocket gear 312 provided on third sprocket 31 and sprocket gear 322 provided on fourth sprocket 32. In this embodiment, intermediate gear 35 is shared to directly rotate third sprocket 31 and fourth sprocket 32 together.

Further, second driving device 30 has angle detecting device 36 for detecting the angle of intermediate gear 35. Angle detecting device 36 is configured from a Hall magnet and a Hall sensor. The Hall magnet is provided at a predetermined position on intermediate gear 35. The Hall sensor is fixed to feeder main body 10 and detects the Hall magnet. With this configuration, second driving device 30 detects that third sprocket 31 and fourth sprocket 32 rotated by intermediate gear 35 and intermediate gear 35 are at the prescribed angles based on the detection result of angle detecting device 36.

Tape support unit 40 is arranged above rail 11 on which first driving device 20 is located in the conveyance direction of tape 90. Tape support unit 40 presses tape 90 interposed with rail 11 against rail 11 to restrict the upward motion of tape 90. Tape support unit 40 thereby assists in the engagement of engagement holes 96 of tape 90 with first sprocket 21 and second sprocket 22 of first driving device 20. The tape support unit 40 also supports replenishment tape 90 that has been inserted in advance to come after current tape 90.

Figure 3:
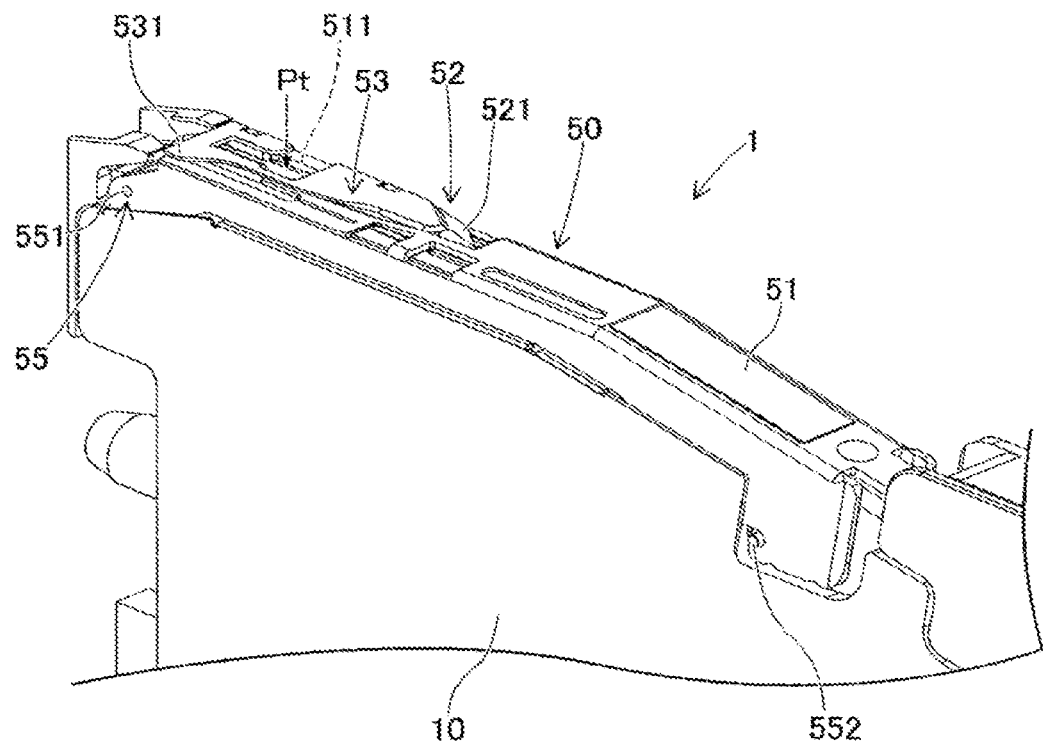
FIG. 3 is an enlarged perspective view of the leading end section of FIG. 1.

Tape guide 50 is arranged above rail 11 along which third sprocket 31 and fourth sprocket 32 of second driving device 30 are located in the conveyance direction of tape 90. Tape guide 50 restricts the upward movement and the width direction movement of tape 90 to guide the engagement of tape 90 with third sprocket 31 and fourth sprocket 32. As shown in FIGS. 3 and 4, tape guide 50 includes guide main body 51, peeling device 52, and folding device 53.

Guide main body 51 is formed with an overall shape having a U-shaped cross section that opens downward. Cutout section 511 is formed on an upper wall of guide main body 51 in an area including supply section Pt. This allows tape guide 50 to make components able to be collected from cavity 95 of tape 90 positioned at supply section Pt. On the other hand, tape guide 50 is configured such that the cavity 95 in the standby position Ps on the insertion section side of cavity 95 from the cavity 95 at supply section Pt (left side in FIG. 4) does not have its opening section exposed.

Peeling device 52 is provided on guide main body 51. Peeling device 52 includes peeling blade 521 that separates the adhesive section that connects base tape 91 and cover tape 92. Peeling blade 521 is arranged so that the cutting edge protrudes downwardly from the inner peripheral surface of the upper wall of guide main body 51 by about the thickness of cover tape 92 (see FIG. 7A). As a result, peeling blade 521 cuts into the adhesive section between base tape 91 and cover tape 92 as tape 90 is conveyed so as to peel off cover tape 92 (refer to FIG. 7C).

Further, in the present embodiment, peeling blade 521 has one side in the cutting edge width direction (the lower side in FIG. 4) located outside tape 90 in the width direction, and the other side in the cutting edge width direction (the upper side in FIG. 4) located inside tape 90 in the width direction. Thus, the edge section of base tape 91 on the engagement hole 96 side is kept adhered to base tape 91 in the widthwise direction of cover tape 92. In this manner, peeling device 52 peels cover tape 92 from base tape 91 while leaving a portion of the cover tape in a width direction connected to the base tape.

Folding device 53 is provided on guide main body 51, and is positioned closer to supply section Pt than the cutting edge of peeling blade 521 in peeling device 52. Folding device 53 raises a portion of cover tape 92 peeled by peeling device 52 while leaving a portion of cover tape 92 on base tape 91, and folds cover tape 92 towards engagement holes 96. Thus, the opening sections of cavities 95 of base tape 91 are not covered by cover tape 92.

More specifically, as shown in FIG. 4, folding device 53 raises and folds cover tape 92 (a portion visible in FIG. 4 is shaded) peeled off over a specified interval in the conveyance direction. As a result, cover tape 92 is completely folded toward engagement holes 96 before and after standby position Ps. Further, folding device 53 includes regulating section 531 that contacts an edge section in the width direction of the back surface (the surface bonded to base tape 91) of folded cover tape 92 and maintains cover tape 92 in a folded state.

Biasing device 55 biases guide main body 51 towards rail 11 such that tape 90 is held between rail 11 and guide main body 51 constituting conveyance path R1. More specifically, biasing device 55 includes protrusions 551 and 552 that vertically engage with guide main body 51 at the front and rear of the side walls on both sides of guide main body 51. Biasing device 55 biases guide main body 51 that engages with protrusions 551, 552 downward as a whole by an elastic force of a spring (not shown).

According to the above configuration, tape guide 50 holds tape 90 between rail 11 and guide main body 51 by conveying tape 90 to the supply section Pt side. Further, as tape 90 is conveyed, tape guide 50 bends cover tape 92 while peeling off cover tape 92 from base tape 91, so as to expose the component such that the component can be removed at supply section Pt. A portion of tape 90 that has passed through supply section Pt is discharged to the outside of feeder 1 from a tape discharge section (not shown) formed in the front section of feeder main body 10.

Detection sensor 61 detects the leading end of tape 90 in conveyance path R1 between insertion section Pi and supply section Pt. Detection sensor 61 detects the leading end (or the trailing end) of tape 90 due to the switching between the presence and absence of tape 90 at the detecting position. Detection sensor 61 may be a contact-type or non-contact-type sensor. Detection sensor 61 is arranged such that the conveyance distance from supply section Pt in the conveyance direction of tape 90 is a specified distance.

Control device 70 is configured mainly from a CPU, various types of memory, and control circuits. When feeder 1 is set on the component mounter, power is supplied from the component mounter via the connector and control device 70 becomes ready to communicate with the component mounter. Control device 70 controls operation of first driving device 20 and second driving device 30 based on control commands from the component mounter or the like. As a result, control device 70 performs loading processing for loading tape 90 into feeder 1; feeding processing for feeding tape 90 at predetermined pitches; and unloading processing for removing tape 90 from feeder 1.

Here, in the loading processing described above, when control device 70 detects that the leading end of tape 90 has been inserted via insertion section Pi by the sensor (not shown), first driving device 20 is driven, and conveyance of tape 90 is started. At this time, the engagement protrusions of first sprocket 21 and second sprocket 22 are sequentially engaged with engagement holes 96 at the leading end of tape 90, and tape 90 is conveyed towards supply section Pt at a constant velocity.

When the leading end of tape 90 is detected by detection sensor 61, control device 70 calculates the remaining conveyance amount in accordance with the conveyance distance from detection sensor 61 to supply section Pt. Here, among the multiple cavities 95 in tape 90, the first cavity 95 from the leading end in which a component is housed is referred to as first cavity 95F (refer to FIG. 6). During loading processing, after the leading end of tape 90 has been detected by detection sensor 61, control device 70 conveys tape 90 by the conveyance amount calculated as described above, to position first cavity 95F at a specified position in feeder main body 10. Details regarding loading processing are described later.

Further, control device 70 controls the conveyance amount of tape 90 based on the angles and rotational amounts of first sprocket 21 and second sprocket 22 of first driving device 20 and third sprocket 31 and fourth sprocket 32 of second driving device 30. More specifically, control device 70 calculates the angles of third sprocket 31 and fourth sprocket 32 based on the angle of intermediate gear 35 detected by angle detecting device 36 and the rotational amounts of intermediate gear 35 according to the pulse power inputted to stepping motor 33.

Then, control device 70 acquires the rotation amounts of third sprocket 31 and fourth sprocket 32 based on the rotation amounts of intermediate gear 35 corresponding to the pulse power inputted to stepping motor 33 up to that point after angle detecting device 36 has detected that intermediate gear 35 is at the prescribed angle. Similarly, control device 70 calculates the angles of first sprocket 21 and second sprocket 22 in first driving device 20, and acquires the rotational amounts thereof. Control device 70 synchronizes first driving device 20 and second driving device 30 during the loading processing and supply processing to position cavity 95 of tape 90 at a specified position, such as supply section Pt.

1-4. Loading Processing by Feeder 1 and a Loading Method for Tape 90

Figure 7A:
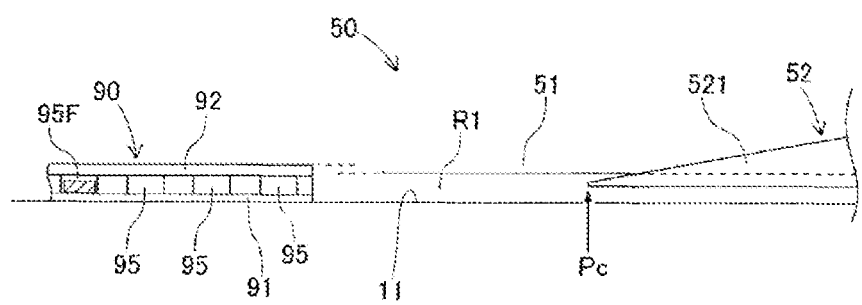
FIG. 7A is a cross section showing a state of a tape guide before loading of carrier tape.
Figure 7B:
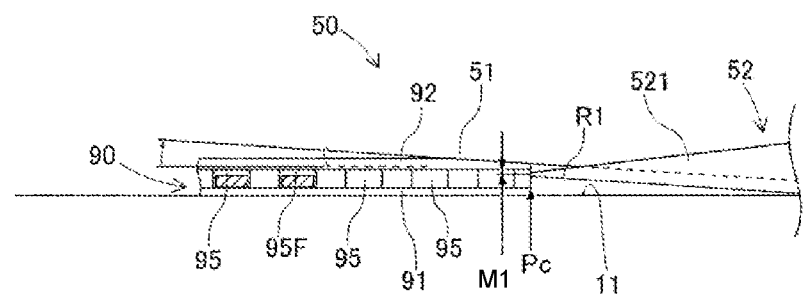
FIG. 7B is a cross section showing a state when a peeling blade starts separation at the leading end of the carrier tape when peeling of the carrier tape is started.
Figure 7C:
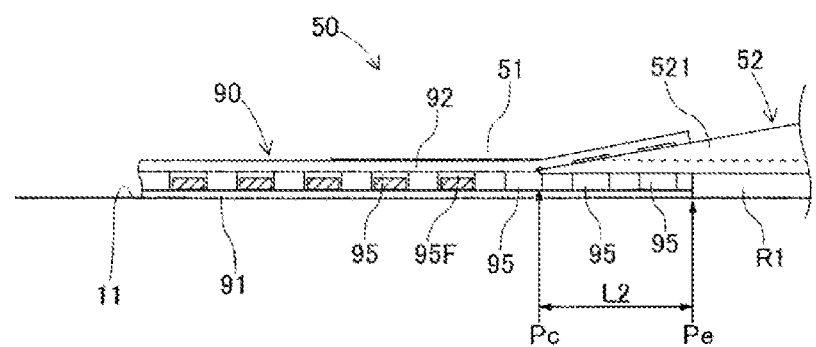
FIG. 7C is a cross section showing a state in which the leading end of the carrier tape is conveyed from the separating position to the position at which pushing of the tape guide ends.

Loading processing according to feeder 1 and a loading method for tape 90 will be described referring to FIGS. 4 to 7C. In FIGS. 7A to 7C, components housed in cavities 95 are indicated with shading. Here, tape 90 loaded in feeder 1 is assumed to be a new tape 90 or, for example, a used tape 90 that has been removed from a feeder 1 by unloading processing. New tape 90 may have a number of empty cavities 95 closer to the leading end of the tape than first cavity 95F that is the first cavity in which a components is housed. A used tape 90 may or may not have a varying number of empty cavities 95 closer to the leading end of the tape than first cavity 95F, based on, for example, a position at which the tape has been cut by an operator.

When loading processing is performed using a tape 90 with many empty cavities 95 such as new tape 90, during subsequent mounting processing, empty cavities 95 are positioned at supply section Pt until first cavity 95F housing a component is positioned at supply section Pt. As a result, a supply error may occur in which a component is not available. Therefore, in order to curtail occurrences of supply errors, it is desirable for the quantity of empty cavities 95 at the leading end side of the first cavity 95F to be small.

On the other hand, if tape 90 cut so that there are no empty cavities 95 at the leading end side of first cavity 95F is loaded into feeder 1, the following problems may occur. First, when first cavity 95F is positioned at supply section Pt, an error may occur in which first cavity 95F is shifted in the width direction of tape 90. This may be considered to be due to the action of a force that tends to return cover tape 92 to its original state, because when the cover tape 92 peeled off from base tape 91 is folded by folding device 53, the adhesive state of a portion of the cover tape 92 in the width direction is maintained.

In detail, since cover tape 92 tending to return to its original state is regulated in an upright position by folding device 53, tape 90 may move slightly in the widthwise direction as a whole due to the reaction force. This slight displacement of tape 90 also causes the component housed in first cavity 95F to move, which may cause instability in the supply of the component. Note that, the reaction force gradually increases along a specified section in the conveyance direction in which folding device 53 folds cover tape 92, and when loading is completed, the reaction force becomes substantially constant and a slight shift in the widthwise direction of tape 90 does not occur.

Therefore, in order to suppress movement of tape 90 in the width direction, it is desirable to perform supply processing after a specified length or more of tape 90 has passed supply section Pt. To cope with the above-mentioned problems, during loading processing, control device 70 conveys the leading end of tape 90 so as to pass a certain length from the supply section Pt. However, in such processing, components housed in cavities 95 that pass through supply section Pt are not supplied to the component mounter and are wasted.

Second, if tape 90 cut such that there are no empty cavities 95 at the leading end side of first cavity 95F is loaded into feeder 1, there is a possibility that peeling blade 521 of tape guide 50 will contact a component housed in the cavity 95 at the leading end of tape 90. Contact between a component and peeling blade 521 may result in damage to both. Specifically, at a stage before tape 90 has reached between rail 11 and tape guide 50, tape guide 50 biased downward by biasing device 55 is positioned such that the inner surface of the upper wall of tape guide 50 is lower than the upper surface of tape 90, as shown in FIG. 7A.

Tape 90 enters between rail 11 and tape guide 50 and at a stage when the leading end of tape 90 reaches separating position Pc of peeling blade 521 (the position of the cutting edge of peeling blade 521 in the conveyance direction), as shown in FIG. 7B, tape guide 50 is pushed up by the leading end of tape 90 against the biasing force of biasing device 55. At this time, when only the insertion section Pi side is pushed up, guide main body 51 is overall inclined in the conveyance direction.

Then, the cutting edge of peeling blade 521 is located at a position lower than the height after the loading is completed, and the cutting edge may perform separation at a position lowered by lowering distance M1 from the adhesive section between base tape 91 and cover tape 92. If tape 90 is conveyed in this state, peeling blade 521 cuts into a deep position with respect to cavity 95 at the leading end section of tape 90, and if a component is housed in the cavity 95, the component may be contacted. Therefore, in order to prevent contact between the component and peeling blade 521, it is desirable that a component is not housed in the leading distal end section of tape 90.

Note that, when peeling blade 521 initially starts to cut into the leading end section of tape 90, the leading end of base tape 91 that has passed separating position Pc of peeling blade 521 pushes peeling blade 521 against the biasing force of biasing device 55 to the opposite side to rail 11. As a result, guide main body 51 is pushed up as a whole so as to be parallel to rail 11 as shown in FIG. 7C. Then, the cutting height of peeling blade 521 becomes substantially the same as that after the completion of the loading, and peeling blade 521 cuts into the adhesive section between base tape 91 and cover tape 92.

Figure 5:
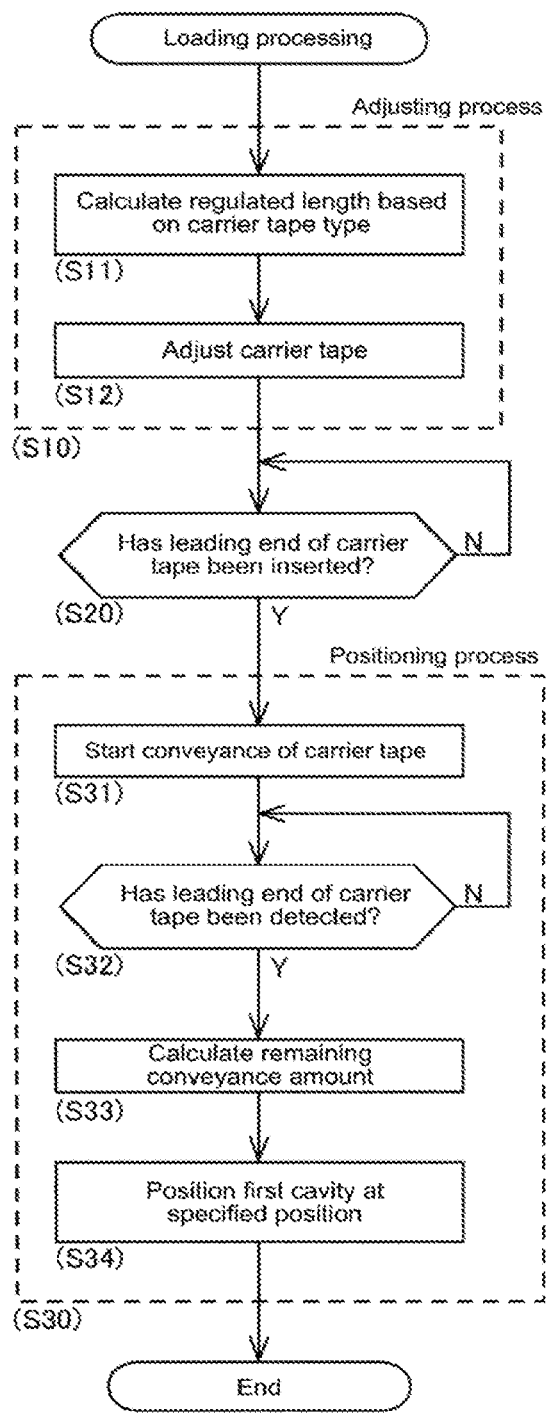
FIG. 5 is a flow chart showing carrier tape loading processing.

In view of the above circumstances, it is desirable that tape 90 to be loaded is provided with a redundant section having an appropriate length in which components are not housed at the leading end from the cavity 95 which is initially positioned at supply section Pt after loading. Here, a section from the leading end side first cavity 95F that is the first cavity from the leading end side of tape 90 in which a component is housed to the leading end side of tape 90 is defined as a redundant section. During loading processing, as shown in FIG. 5, an adjusting process (step 10 [hereinafter, "step" is referred to as "S"]) is performed in advance such that the length from first cavity 95F to the leading end of tape 90, that is, the length of the redundant section, becomes regulated length Ls.

In detail, in the adjusting process (S10), first, regulated length Ls is set based on the type of the tape 90 (S11). The type of the tape 90 is defined by the relationship between interval T1 of cavities 95 and interval T2 of engagement holes 96. In the present embodiment, regulated length Ls is specifically set so as to satisfy the following conditions (A) to (E). Condition (A) is to set regulated length Ls equal to or greater than the length from supply section Pt to regulating section 531 of folding device 53 in the conveyance direction of tape 90 (also referred to as "first length L1" [refer to FIG. 4]) (that is, Ls≥L1).

As described above, a problem in which the cavity 95 positioned at supply section Pt is shifted in the width direction may occur due to the action of the force acting to return cover tape 92 detached from base tape 91 to its original state. Here, in the present embodiment, folding device 53 regulates the folded cover tape 92 by gradually increasing the number of contact points from the folded section to the edge section moving towards the leading end of feeder 1. Folding device 53 contacts the edge section in the width direction of the back surface of cover tape 92 by regulating portion 531 provided at a regulated position in the conveyance direction to maintain the state of folded cover tape 92.

Thus, when the leading end of tape 90 passes regulating section 531, the reaction force received by cover tape 92 becomes substantially constant, and the tape 90 does not move slightly in the width direction. Therefore, the regulated length Ls is set to be equal to or greater than the above first length L1 (Ls≥L1). Accordingly, when the first cavity 95F is positioned at supply section Pt, the leading end of tape 90 reaches regulating section 531. That is, the position of the first cavity 95F in the width direction becomes stable, and as a result, the supply of components can be stabilized.

Condition (B) is to set regulated length Ls equal to or greater than a length (hereinafter, referred to as "second length L2") in a conveyance direction of tape 90 from the separating position Pc to position Pe at which pushing up by base tape 91 is completed (see FIG. 7C) (that is, Ls≥L2). As described above, a problem of peeling blade 521 contacting a component housed in the leading end section of tape 90 by peeling blade 521 separating base tape 91 and cover tape 92 at a position lower than the adhesive section may be caused by tape guide 50 tilting initially when tape 90 enters between rail 11 and tape guide 50.

Here, when the leading end of tape 90 is conveyed to some extent after passing separating position Pc, the leading end of base tape 91 pushes the peeling blade 521 up to the opposite side to rail 11 against the biasing force of biasing device 55, and the cutting edge of peeling blade 521 is positioned at the height of the adhesive section connecting base tape 91 and cover tape 92. Therefore, the regulated length Ls is set to be equal to or greater than the above second length L2 (Ls≥L2). By this, even if the cutting edge of peeling blade 521 cuts into cavity 95 prior to being pushed up to the height of the adhesive section, that cavity 95 is empty, so components can be reliably prevented from contacting peeling blade 521.

Condition (C) is to set regulated length Ls equal to or greater than twice interval T2 of engagement holes 96 from first cavity 95F to the leading end side, and equal to or less than five times interval T2 of engagement holes 96 (5×T2≥Ls≥2×T2). According to such a configuration, since the length from first cavity 95F to the leading end of tape 90 is appropriately adjusted, it is possible to stabilize the supply of components and to reduce the generation of wasted components. Note that, condition (C) may be a condition for setting regulated length Ls within a range further limited within the above range, depending on the configuration of tape guide 50 or the like. In the present embodiment, the condition (C) sets regulated length Ls to three times or more the length of interval T2 of engagement holes 96 and five times or less the length of interval T2 of engagement holes 96 (5×T2≥Ls≥3×T2) in order to further stabilize the supply of components.

Condition (D) is to set regulated length Ls to a length such that the regulated length Ls ends at a position shifted from empty cavities 95 that does not house a component further to the leading end of the tape than first cavity 95F. According to such a configuration, the leading end of tape 90 having a redundant section with regulated length Ls is positioned so as to avoid an empty cavity located on the leading end side from first cavity 95F. It has been found that an absence of the cross-section of cavity 95 at the leading end of tape 90 curtails the generation of defects during loading processing. Therefore, by setting regulated length Ls to satisfy condition (D) as described above, it is possible to curtail the occurrence of problems during loading processing.

Condition (E) is to set regulated length Ls to be, as a rule, as short as possible after satisfying the above conditions (A) to (D). As a result, it is possible to prevent regulated length Ls from becoming excessive, and thus it is possible to curtail the occurrence of supply errors in which many of the empty cavities 95 are positioned at supply section Pt. Further, since the conveyance quantity of tape 90 during loading processing can be reduced, the time required for processing can be shortened. However, regulated length Ls is not necessarily set as the shortest candidate due to various circumstances. Such circumstances may include, for example, ensuring workability during adjustment of tape 90.

Specifically, in a case of tape 90 in which interval T1 between cavities 95 is set to half interval T2 between engagement holes 96 (the first and second levels from the top in FIG. 6), there are multiple candidates (Cp1, Cp2, and so on) for adjustment positions that satisfy the above conditions (A) to (D). Here, although the tape 90 of the first and second levels from the top of FIG. 6 are of the same type, the position of first candidate Cp1 is shifted due to the positional relation between first cavity 95F and the engagement hole 96. Therefore, if first candidate Cp1 leading to the shortest length from first cavity 95F to the leading end is always used, the positional relationship between first cavity 95F and engagement hole 96 needs to be grasped, and therefore, the workability may be lowered.

Therefore, condition (E) is such that, while satisfying the above-mentioned conditions (A) to (D), the candidate positioned first on the first cavity 95F side from a specified engagement hole 96 (for example, the fourth engagement hole 96 on the leading end side from first cavity 95F) is set to regulated length Ls (this is second candidate Cp2 for the first level from the top in FIG. 6, or first candidate Cp1 for the second level from the top in FIG. 6). As a result, for example, the adjustment position is set between the fourth engagement hole 96 on the leading end side from first cavity 95F (according to condition [C]) and the first empty cavity 95 initially adjacent on the first cavity 95F side (according to condition [D]). Therefore, regulated length Ls is set in accordance with the positional relationship between first cavity 95F and engagement hole 96, and the adjustment position becomes constant with respect to the specified engagement hole 96. As a result, an operator can easily recognize the adjustment position, and the workability of adjustment of the tape 90 is ensured.

Next, tape 90 is adjusted based on the regulated length Ls set in step S11 (S12). Various methods may be used as an adjustment method of tape 90. For example, when a new tape 90 is loaded, the tape 90 is adjusted by an operator cutting at regulated length Ls so as to leave a portion of the large quantity of empty cavities 95 existing at the leading end side of first cavity 95F. Thus, for example, for tape 90 in which interval T1 between cavities 95 is set to half of interval T2 between engagement holes 96, as shown in the first and second levels from the top of FIG. 6, the leading end of tape 90 after adjustment is located at a position that is shifted from both cavities 95 and engagement holes 96.

Further, for tape 90 in which interval T1 between cavities 95 is equal to interval T2 between engagement holes 96, as shown in the third level from the top of FIG. 6, the leading end of the adjusted tape 90 is positioned at a center portion of an engagement hole 96 shifter only from cavities 95. Further, for tape 90 in which interval T1 between cavities 95 is set to twice interval T2 between engagement holes 96, as shown in the third level from the top of FIG. 6, the leading end of the adjusted tape 90 is positioned at a central portion between adjacent cavities 95 and a center portion between adjacent engagement holes 96.

Also, as described above, as an adjustment method of tape 90, an operator performs cutting, but tape 90 may be cut by an external device that automatically cuts the tape 90 based on the regulated length Ls set in S11. Further, for adjusting a used tape 90, if the leading end portion of the used tape 90 is long enough, it can be dealt with by cutting in the same manner as the above-mentioned adjustment for new tape 90.

However, if the leading end of the used tape 90 is shorter than regulated length Ls, it may be desirable to perform adjustment to maintain the redundant section of regulated length Ls by removing components from one or multiple cavities 95 that house components at the leading end section of the tape. In addition, supplementary tape corresponding to the redundant section may be connected to the leading end of the tape 90 in order to secure the regulated length Ls. Similar to with new tape 90, adjustments to used tape 90 including removing components and connecting supplementary tape may be performed automatically by an external device.

Continuing, control device 70 of feeder 1, in a state with power being supplied via a connector from the component mounter, determines whether the leading end of tape 90 adjusted with respect to insertion section Pi has been inserted (S20). Control device 70 maintains a standby status of repeating the above determination while the leading end of adjusted tape 90 has not been inserted (S20: no). On the other hand, when control device 70 determines that the leading end of tape 90 adjusted with respect to insertion section Pi has been inserted (S20: yes), the positioning process is performed (S30).

In the positioning process, when adjusted tape 90 is inserted into insertion section Pi (S20: yes), control device 70 first starts conveying the tape 90 (S31). As a result, the tape 90 moves along rail 11 constituting conveyance path R1 by the operation of first driving device 20. Control device 70 determines whether the leading end of tape 90 has been detected based on the detection result of detection sensor 61 (S32). Control device 70 repeats the above determination while the leading end of the tape 90 is not detected (S32: no).

On the other hand, control device 70, upon determining that the leading end of tape 90 has been detected by detection sensor 61 (S32: yes), calculates the remaining conveyance amount based on the conveyance distance from detection sensor 61 to supply section Pt (S33). Further, control device 70 starts operation by synchronizing second driving device 30 with first driving device 20, although the leading end of tape 90 has not reached the position of engaging with third sprocket 31 of second driving device 30. Then, control device 70 calculates the angle of fourth sprocket 32 based on the detection result of angle detection device 36 and the pulse power supplied to stepping motor 33.

In the present embodiment, control device 70 calculates the remaining conveyance amount so as to position first cavity 95F at a specified position in feeder main body 10 based on the detection result of detection sensor 61, the angle of fourth sprocket 32, and interval T1 of the multiple cavities 95 (S33). Control device 70 synchronously operates first driving device 20 and second driving device 30 according to the calculated remaining conveyance amount, thereby positioning first cavity 95F at the specified position (S34).

As described above, the remaining conveyance amount is calculated (S33) because, when the tape 90 is adjusted by cutting or the like in the adjusting process (S10), an error may be included in the length from first cavity 95F to the leading end and in the ideal regulated length Ls calculated in S11. That is, when tape 90 is conveyed by a specified distance after detection sensor 61 detects the leading end of tape 90, an error is included in the position at which first cavity 95F is positioned according to the size of the error generated by the adjustment. Therefore, control device 70 improves the positioning accuracy of first cavity 95F based on the angle of fourth sprocket 32 and interval T1 between the multiple cavities 95.

Here, when one of the multiple cavities 95 is positioned at supply section Pt during component supply processing, one of the multiple engagement protrusions 321 of fourth sprocket 32 is positioned at an angle directly above the rotational center Cr of fourth sprocket 32 (see FIG. 4). Therefore, control device 70 can accurately grasp the distance from the leading end of tape 90 to first cavity 95F based on the detection result of detection sensor 61 and the angle of fourth sprocket 32. That is, even there is an error with respect to regulated length Ls due to cutting or the like in the adjusting process (S10), first cavity 95F can be positioned so as to absorb the error.

Note that, in the present embodiment, the specified position at which first cavity 95F is positioned is standby position Ps at which first cavity 95F is positioned when the cavity 95 one cavity to the leading end side of first cavity 95F is positioned at supply section Pt. The first cavity 95F positioned at standby position Ps maintains a state in which, even though cover tape 92 has been peeled oft the opening section is not exposed, due to being covered by tape guide 50. Thereby, it is possible to prevent the component from falling out from first cavity 95F due to some factor.

As described above, while first cavity 95F is moving to standby position Ps, the leading end of tape 90 enters between rail 11 and tape guide 50, and tape guide 50 is partially pushed up. When tape 90 is conveyed further, cover tape 92 is peeled off by peeling device 52 and begins to be folded by folding device 53. At this time, even if the cutting edge of peeling blade 521 cuts downward from the adhesive section between base tape 91 and cover tape 92, the redundant section does not house any components, and peeling blade 521 and the components are prevented from contacting each other.

Thereafter, peeling blade 521 is pushed up by base tape 91 from which cover tape 92 has been peeled off, such that the cutting edge of peeling blade 521 is at a height at which it cuts into the adhesive section between base tape 91 and cover tape 92. On the other hand, since regulated length Ls is secured by the adjusting process (S10), first cavity 95F is positioned closer to insertion section Pi than the standby position Ps at the stage where the leading end of tape 90 is positioned at position Pe (see FIG. 7C) where the pushing up of peeling blade 521 by base tape 91 is finished. This prevents peeling blade 521 from contacting the component housed in first cavity 95F.

When first cavity 95F is positioned at standby position Ps as described above, control device 70 stops operation of first driving device 20 and second driving device 30, and ends loading processing. In the present embodiment, when loading processing is completed, the leading end of tape 90 is positioned closer to supply section Pt than regulating portion 531 of folding device 53 by the interval T1 of cavities 95. Feeder 1 stands by in this state, and, for example, when supply processing is started the component mounter requests supply of a component, moves tape 90 by interval T1 so as to position first cavity 95F at supply section Pt.

Further, during the positioning process (S30), when cover tape 92 peeled from base tape 91 by peeling device 52 is folded towards engagement holes 96 by folding device 53, tape 90 may be moved slightly in the width direction by the force of the cover tape 92 trying to return to its original state. With respect to this, since regulated length Ls is secured by the adjusting process (S10), cover tape 92 reaches regulating section 531 of folding device 53 when first cavity 95F is positioned at supply section Pt at the latest. As a result, the state of first cavity 95F in the width direction becomes stable, thus, the supply of components during supply processing is stabilized.

2. Effects of Embodiments

According to feeder 1 configured as above and the configuration of a carrier tape loading process including the adjusting process (S10) and the positioning process (S30), tape 90 whose length from first cavity 95F to the leading end is adjusted to regulated length Ls can be loaded so as to position first cavity 95F at a specified position in feeder main body 10. As a result, when first cavity 95F is positioned at supply section Pt, the widthwise position of tape 90 is stabilized because the leading end of regulated length Ls is secured, and as a result, the supplying of components is stabilized. Further, since the components are not housed at further to the leading end side than first cavity 95F, wasting of electronic components is prevented.

3. Alternative Embodiments 3-1. Regulated Length Ls of Tape 90

In an embodiment above, regulated length Ls is set so as to satisfy conditions (A) to (E) as an example. However, regulated length Ls may be set such that only at least one of conditions (A) to (D) are satisfied. For example, in an embodiment above, condition (B) is given because tape guide 50 is biased by biasing device 55 such that tape guide 50 is inclined, but if the configuration is such that tape guide 50 does not become inclined, regulated length Ls does not need to satisfy condition (B).

3-2. Others

In an embodiment above, when peeling device 52 of tape guide 50 peels cover tape 92 from base tape 91 such that a portion of cover tape 92 in the width direction remains on base tape 91, the adhesive state is maintained for a portion of cover tape 92 on the engagement hole 96 side. However, peeling device 52 may peel such that only a portion opposite the engagement hole 96 side remains, or such that portions both on the engagement hole 96 side and opposite the engagement hole 96 side remain. In such a configuration too, the same effects as the above embodiment can be achieved by setting regulated length Ls so as to satisfy each condition.

Further, in an embodiment above, the specified position at which first cavity 95F is positioned in the positioning process (S30) is standby position Ps on the insertion section Pi side by interval T1 of cavities 95 from supply section Pt. However, various positions may be used as the specified position. For example, control device 70 may set supply section Pt to the specified position, or the specified position may be moved from standby position Ps to the insertion section Pi side by a multiple of interval T1 between cavities 95.

In an embodiment above, angle detecting device 36 is composed of a Hall magnet and a Hall sensor. However, angle detecting device 36 may adopt various modes as long as angle detecting device 36 can detect the angles of third sprocket 31 and fourth sprocket 32. Specifically, angle detecting device 36 may employ a magnetic type or an encoder type. Further, angle detecting device 36 is configured to detect the angles of third sprocket 31 and fourth sprocket 32 linked to intermediate gear 35 based on the angle of intermediate gear 35. However, angle detecting device 36 may be configured to directly detect the angle of fourth sprocket 32, for example.

REFERENCE SIGNS LIST

1: tape feeder;
10: feeder main body;
11: rail;
20: first driving device;
30: second driving device;
31: third sprocket;
32: fourth sprocket;
36: angle detecting device;
40: tape support unit;
50: tape guide;
51: guide main body;
52: peeling device;
521: peeling blade;
53: folding device;
531: regulating section;
55: biasing device;
61: detection sensor;
70: control device;
90: carrier tape;
91: base tape;
92: cover tape;
95: cavity;
95F: first cavity;
96: engagement hole;
Pi: insertion section;
Pt: supply section;
Pc: cutting position;
Pe: position where pushup is completed;
R1: conveyance path

The invention claimed is:
1. A tape feeder comprising:
a feeder main body including an insertion section into which a leading end of a carrier tape housing electronic components is inserted, and a supply section at which the electronic components are supplied to an electronic component mounting machine;
a driving device provided on the feeder main body and configured to convey the carrier tape, the driving device including a sprocket on which engagement protrusions are formed that are configured to engage with the carrier tape;
a detection sensor configured to detect a leading end of the carrier tape at a conveyance path provided between the insertion section and the supply section;
control circuitry configured to control the driving device such that the carrier tape inserted into the insertion section is conveyed to the supply section, and perform loading processing of loading the carrier tape, wherein
multiple cavities housing the electronic components are formed in the carrier tape at a specified interval in a conveyance direction of the carrier tape, wherein the carrier tape is preadjusted such that a length from a first cavity, which is a cavity among the multiple cavities closest to the leading end of the carrier tape that houses one of the electronic components, to the leading end of the carrier tape is a regulated length, and
an angle detecting sensor configured to determine an angle of the sprocket, wherein when one of the multiple cavities is at the supply position, one of the engagement protrusions is oriented at a predetermined angle of the sprocket above a rotational center of the sprocket, wherein
during the loading processing, the control circuitry is configured to start conveyance of the carrier tape to make a position of the first cavity a specified position in the feeder main body with respect to the supply position in accordance with a detection result of the leading end of the carrier tape detected by the detection sensor, a detection result of an angle of the sprocket with respect to the predetermined angle detected by the angle detecting sensor, and the interval between the multiple cavities.

2. The tape feeder according to claim 1, wherein
the carrier tape includes
base tape in which the cavities are formed, and
cover tape configured to cover opening sections of the cavities,
the tape feeder includes a tape guide provided on the supply section of the feeder main body, wherein
the tape guide includes
a guide main body,
a peeling device provided on the guide main body and configured to peel the cover tape from the base tape in a manner that leaves a portion of the cover tape in a width direction connected to the base tape, and
a folding device provided on the guide main body and configured to fold a portion of the cover tape peeled from the base tape.

3. The tape feeder according to claim 2, wherein
the folding device includes a regulating section configured to contact an edge section in the width direction of a surface of the cover tape that has been folded and to maintain the cover tape in a folded state, and
the regulated length is set to a length at least equal to a length from the supply section to the regulating section in the conveyance direction of the carrier tape.

4. The tape feeder according to claim 2, further comprising:
a biasing device configured to bias the guide main body towards a rail that configures the conveyance path such that the carrier tape is held between the rail and the guide main body.

5. The tape feeder according to claim 4, wherein
the peeling device includes a peeling blade configured to separate a connection section connecting the base tape and the cover tape, wherein
when the peeling blade first starts separating at the leading end of the carrier tape, a leading end of the base tape that has passed a separating position of the peeling blade pushes up the peeling blade against a biasing force of the biasing device to a side opposite to the rail, and
the regulated length is set at least equal to a length in the conveyance direction of the carrier tape from the separating position to a position at which the pushing up by the base tape ends.

6. The tape feeder according to claim 1, wherein
the engagement protrusions are arranged at even intervals in a circumferential direction of the sprocket,
multiple engagement holes configured to engage with the protrusions of the sprocket and formed in the carrier tape at a specified interval in the conveyance direction of the carrier tape, and
the regulated length is set to a length at least twice the interval between the engagement holes from a leading end side of the first cavity and equal to or less than five times the interval between the engagement holes.

7. The tape feeder according to claim 1, wherein
the regulated length is set to a length such that the regulated length ends at a position shifted from any cavities that do not house one of the electronic components further to the leading end of the carrier tape than the first cavity.

8. The tape feeder according to claim 1, wherein
the specified position at which the first cavity is positioned in the loading processing is a standby position at which the first cavity is positioned when a cavity one to the leading end side of the first cavity is positioned at the supply section.

9. The tape feeder according to claim 1, wherein
the engagement protrusions are formed at even intervals in the circumferential direction of the sprocket and are configured to engage with the multiple engagement holes formed at the specified interval in the carrier tape.

10. A carrier tape loading method for loading a carrier tape housing electronic components to a tape feeder, the tape feeder being provided with
a feeder main body including an insertion section into which a leading end of a carrier tape is inserted, and a supply section at which the electronic components are supplied to an electronic component mounting machine,
a driving device provided on the feeder main body and configured to convey the carrier tape, the driving device including a sprocket on which engagement protrusions are formed that are configured to engage with the carrier tape,
a detection sensor configured to detect a leading end of the carrier tape at a conveyance path provided between the insertion section and the supply section,
control circuitry configured to control the driving device such that the carrier tape inserted into the insertion section is conveyed to the supply section, and perform loading processing of loading the carrier tape, wherein multiple cavities housing the electronic components are formed in the carrier tape at a specified interval in a conveyance direction of the carrier tape, and an angle detecting sensor configured to determine an angle of the sprocket, wherein when one of the multiple cavities is at the supply position, one of the engagement protrusions is oriented at a predetermined angle of the sprocket above a rotational center of the sprocket, the loading method comprising:

during the loading processing, performing an adjusting process of preadjusting the carrier tape such that a length from a first cavity, which is a cavity among the multiple cavities closest to the lead end of the carrier tape that houses one of the electronic components, to the leading end of the carrier tape is a regulated length, and, when the preadjusted carrier tape is inserted into the insertion section, performing a positioning process of starting conveyance of the carrier tape and making a position of the first cavity a specified position in the feeder main body with respect to the supply position in accordance with a detection result of the leading end of the carrier tape detected by the detection sensor, a detection result of an angle of the sprocket with respect to the predetermined angle detected by the angle detecting sensor, and the interval between the multiple cavities.

* * * * *